US006670842B2

(12) United States Patent
Kamenicky

(10) Patent No.: US 6,670,842 B2
(45) Date of Patent: Dec. 30, 2003

(54) ELECTROMAGNETIC COMPATIBLE REGULATOR

(75) Inventor: Petr Kamenicky, Brno (CZ)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/195,556

(22) Filed: Jul. 16, 2002

(65) Prior Publication Data

US 2003/0020445 A1 Jan. 30, 2003

(30) Foreign Application Priority Data

Jul. 26, 2001 (EP) ........................................... 01402035

(51) Int. Cl.[7] ............................................... H03K 17/16

(52) U.S. Cl. ........................ 327/389; 327/333; 327/317

(58) Field of Search ................................ 327/103, 379, 327/310, 333, 389, 317; 323/316, 317, 315

(56) References Cited

U.S. PATENT DOCUMENTS

| | | | | |
|---|---|---|---|---|
| 5,436,552 A | | 7/1995 | Kajimoto | |
| 5,510,699 A | | 4/1996 | Theus et al. | |
| 5,546,029 A | * | 8/1996 | Koke | 327/108 |
| 6,184,664 B1 | | 2/2001 | Ponzetta | |
| 6,313,689 B1 | * | 11/2001 | Horchler | 327/379 |
| 6,556,062 B1 | * | 4/2003 | Wallace | 327/434 |

* cited by examiner

*Primary Examiner*—Shawn Riley
(74) *Attorney, Agent, or Firm*—Sughrue Mion, PLLC

(57) ABSTRACT

A voltage regulator circuit for providing a regulated output voltage at an output terminal, the regulator circuit including a current source ($I_{control}$) including a current source MOSFET a current mirror circuit including a driver MOSFET ($M_1$) and a follower MOSFET ($M_2$) interposed between the current source and the output terminal, the current source and current mirror being operatively linked as to regulate an input voltage $V_{in}$ to the regulated output voltage, wherein the circuit further includes an EMC stabilising MOSFET having its drain connected to its substrate and placed in series with any of the driver or follower MOSFETs.

11 Claims, 4 Drawing Sheets

ELECTROMAGNETIC COMPATIBLE REGULATOR

FIELD OF THE INVENTION

The present invention is related to supply regulators. More particularly, the present invention is related to electromagnetic compliant supply regulators.

STATE OF THE ART

Electrical noise has been recognised as a problem for electrical and electronic devices as from the start of electrical engineering itself. Electrical interference and the frequencies at which it occurs are growing with the rapid spread of electrical and electronic devices.

Today, one must recognise that almost any device which operates on the principle of moving an electron from one point to another can be either a source or receiver of Electromagnetic interference (EMI).

When two electrical or electronic devices must operate together in the same environment or in the same system, the potential for conflict between these unintended transmitters and receivers can present significant, and challenging problems. Some problems are obvious in the first prototype of a new device if it tends to 'self interfere'. This can happen when the design results in a strong emitter and a sensitive receiver in the same package.

However, if a circuit is only a strong transmitter, or only a sensitive receiver, the potential for later problems is there, but may not be discovered until the design has left the engineering development laboratory, unless the device is tested for electromagnetic compatibility (EMC).

Traditional transconductance regulators are not EMC safe. They can usually be considered as sensitive receivers. Electromagnetic interference will therefore usually lead to instability of the output. Traditional solutions consist of adding filters in the input line for filtering out the EMC noise on this input signal. Such filters are very expensive and require external components.

AIMS OF THE INVENTION

The present invention aims to provide EMC immunity to transconductance regulators with a p-type active component.

SUMMARY OF THE INVENTION

The present invention is a voltage regulator circuit for providing a regulated output voltage at an output terminal, said regulator circuit comprising

- a current source, comprising a current source MOSFET,
- a current mirror circuit, comprising a driver MOSFET and a follower MOSFET both having the source connected to the substrate, interposed between said current source and said output terminal,
  - operatively linked as to regulate an input voltage $V_{in}$ to said regulated output voltage,
  - characterised in that the circuit further comprises an EMC stabilising MOSFET having its drain connected to its substrate and placed in series with any of said driver or follower MOSFETs.

In an embodiment of the present invention, the gate of the EMC stabilising MOSFET is coupled to the gate of the follower MOSFET, and the drain of the EMC stabilizing MOSFET is coupled to the source of the follower MOSFET.

In another embodiment, the source of the EMC stabilising MOSFET is coupled to the drain of the follower MOSFET.

Preferably, the gate of the EMC stabilising MOSFET is kept at a predetermined voltage ($V_{bias}$). Said predetermined voltage should preferably be external and independent from the input voltage.

In another embodiment, the drain of the EMC stabilising MOSFET is connected to the source of the driver MOSFET.

In a preferred embodiment, the voltage regulator circuit of the invention further comprises a second EMC stabilising MOSFET having its drain connected to its substrate and placed in series with the driver or follower MOSFET. Evidently, this second EMC stabilising MOSFET is placed in series with the MOSFET of the current mirror that wasn't already stabilised by the first EMC stabilising MOSFET.

Preferably, the source of the EMC stabilising MOSFET is connected to the drain of the follower MOSFET and the source of the second EMC stabilising MOSFET is connected to the drain of the driver MOSFET, both gates of said EMC stabilising MOSFET and said second EMC stabilising MOSFET being connected.

Advantageously, the gates of the EMC stabilising MOSFET and the second EMC stabilising MOSFET are kept at a predetermined voltage ($V_{bias}$), which should preferably be external and independent from the input voltage.

Another aspect of the present invention concerns a method for improving EMC stability of an electronic circuit comprising at least one circuit MOSFET, characterised by the step of providing an EMC stabilising MOSFET placed in series with said circuit MOSFET.

SHORT DESCRIPTION OF THE DRAWINGS

DETAILED DESCRIPTION OF THE INVENTION

EMC immunity becomes more and more important. The solution presented in this application is simple and low-cost. The present invention comprises the use of a PMOS with its bulk or substrate connected to the drain as an EMC protection between the device to be protected and the node with the EMC disturbance. Any diode between the input supply and the regulated supply is thereby eliminated by means of an additional diode in an anti-series connection.

In the output driver structure: one transistor (M3) is added with its substrate connected to its drain, and possibly biased by a fixed bias source (see examples 1 and 2).

In the control structure: transistor M4, also with bulk connected to drain, and biased by the same fixed bias as M3, is used as a shield to N1 (see example 3).

The drain of the EMC protecting pMOS transistor is connected with its substrate or bulk, which in most CMOS processes concerns the n-well. This is opposite the transistors used in most active circuitry, such as for instance the current mirror circuitry of the voltage regulator, which have their sources connected to their substrate. The drain contact of the EMC stabilising PMOS is thus for instance connected via a metal line to the n-well contact. However other variant methods for realising this connection can be envisaged.

A regulated supply according to the present invention will stay regulated and constant even under strong EMC conditions on the input supply rail as will be explained in the next paragraphs.

Figure 1:
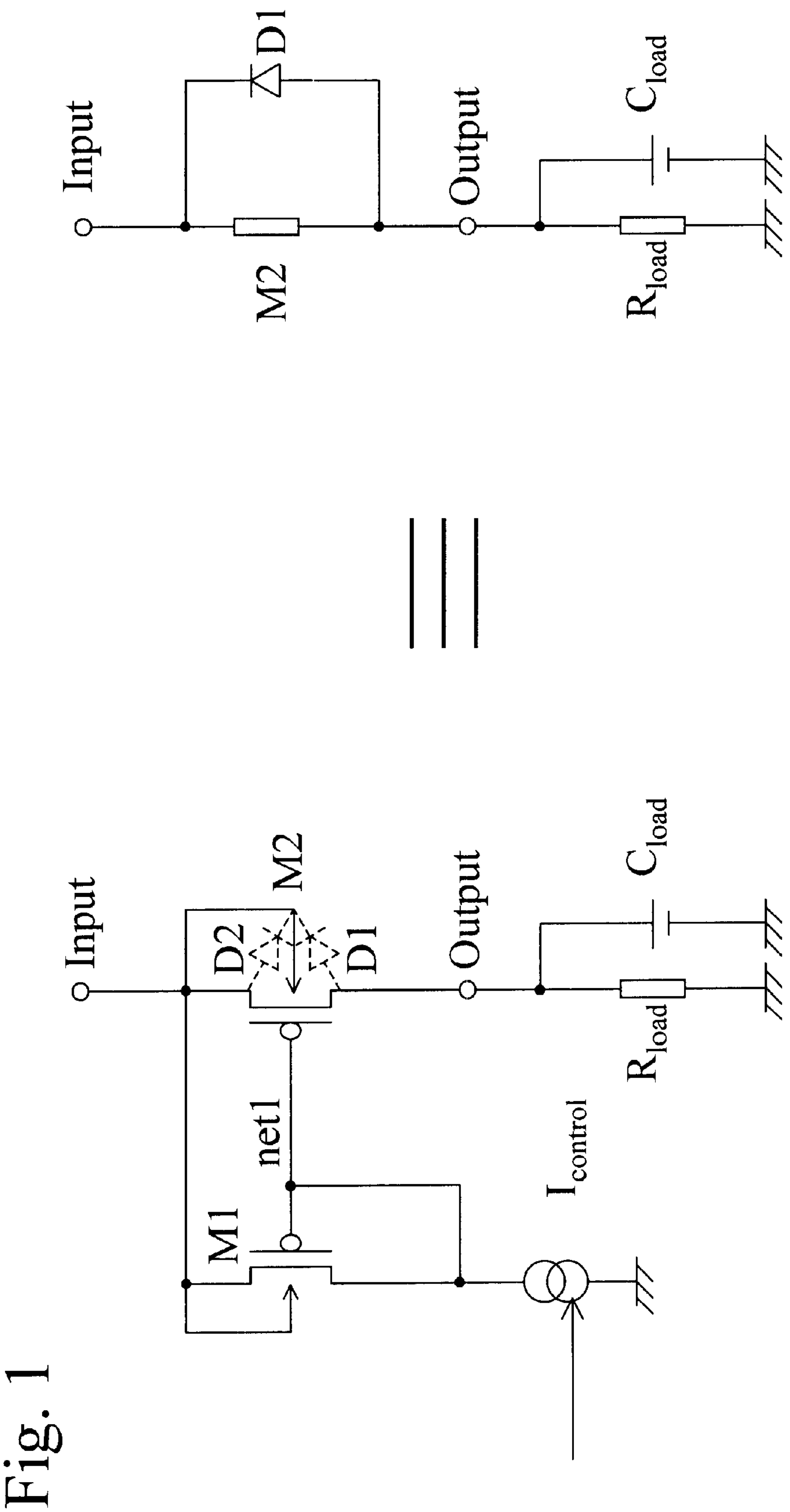
FIG. 1 represents the basic load regulator output structure and its EMC equivalent circuit (preceded by an "equivalent sign".

A basic LD regulator output structure with current mirror, as in the prior art, is shown in FIG. 1. It has no EMC immunity. Indeed, when the input voltage is lower than the output voltage, load capacitor $C_{Load}$ is discharged rapidly via parasitic diode $D_1$. This capacitor is charged only via limited current from $M_2$ when the input voltage is higher than the output voltage. In the case of electromagnetic interference, $C_{Load}$ is thus more discharged than charged and output voltage drops down, which may lead to instability problems. The EMC equivalent of this prior art topology is shown at the right hand side of FIG. 1

The invention will now be further clarified by means of several non-limiting examples and figures.

EXAMPLE 1

Figure 2:
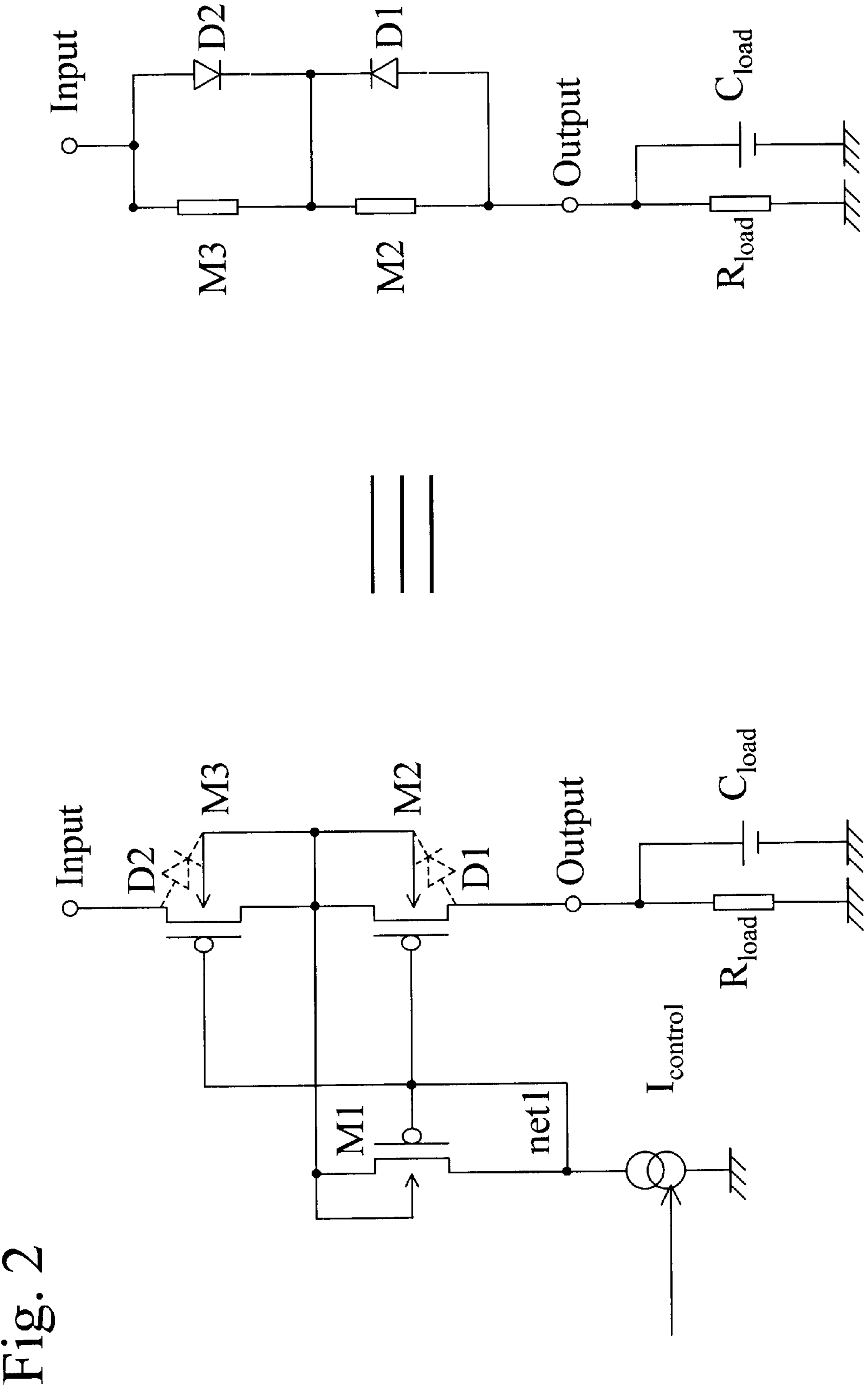
FIGS. 2 and 3 represent embodiments of the present invention and their equivalent EMC circuits.

An improved circuit can be seen in FIG. 2 (left), together with its EMC equivalent circuit (right) When the input voltage is lower than the output voltage, $C_{Load}$ is discharged via $D_1$ and $M_3$ in series; when the input voltage is higher than the output voltage, $C_{Load}$ is charged via $D_2$ and $M_2$ in series. Due to the symmetrical structure, $C_{Load}$ keeps its dc charge, making the circuit more EMC stable.

EXAMPLE 2

Figure 3:
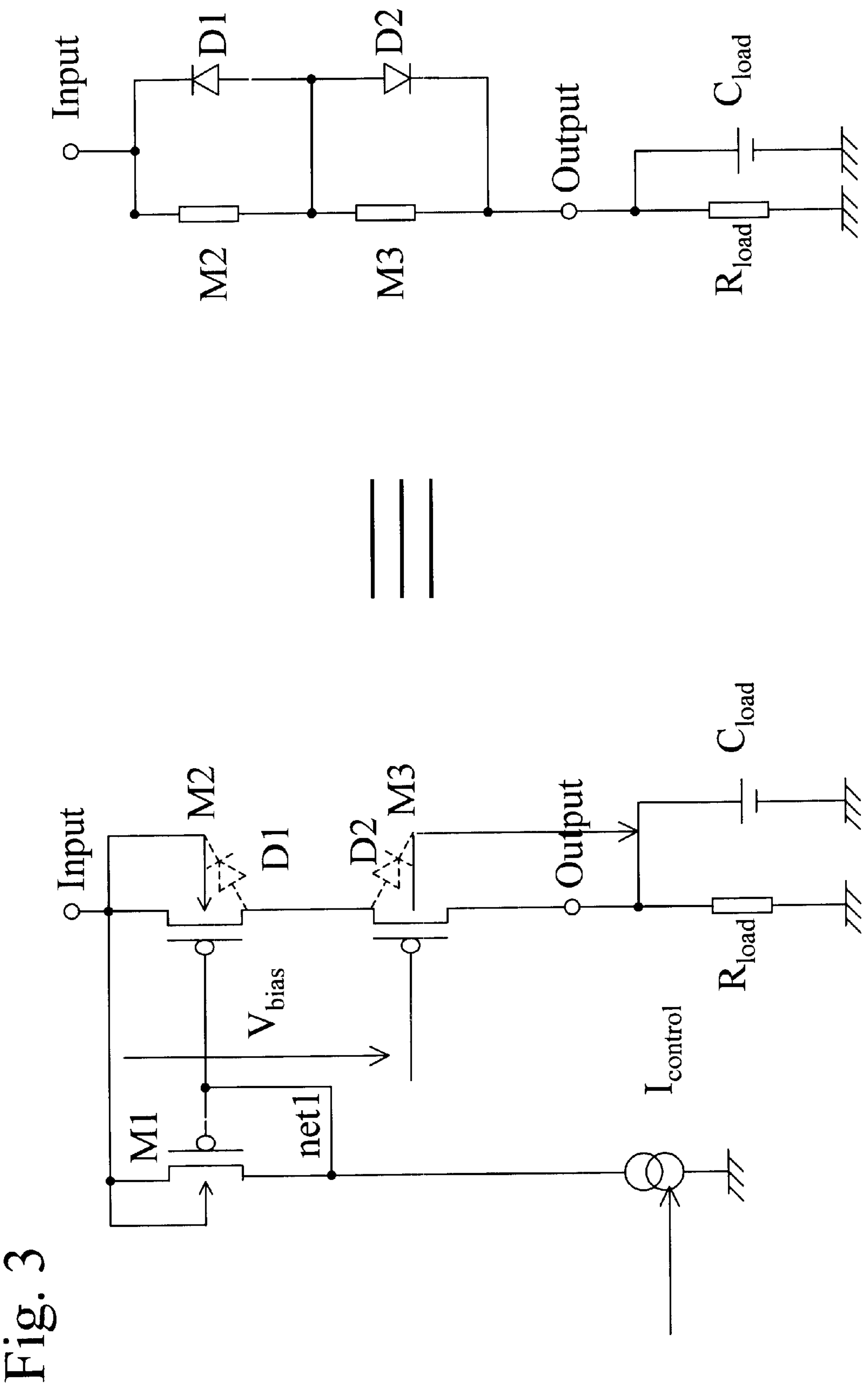

In the embodiment of example 1 an additional gate ($M_3$) is connected to net1. This can lead to stability problems. This problem can be solved by using the circuit as provided in FIG. 3. On the right is provided its EMC equivalent circuit.

Again, discharging of $C_{Load}$ via $D_1$ and $M_3$ in series occurs when the input voltage is lower than the output voltage and when the input voltage is higher than the output voltage, $C_{Load}$ is charged via $D_2$ and $M_2$ in series.

$V_{bias}$ is an external voltage source. Such a biasing voltage source can be easily made from a current source and a resistor and will therefore not be further described.

EXAMPLE 3

Preferred Embodiment of the Invention

The last problem to be avoided to make the circuit fully EMC compliant is the current source device $I_{control}$. It is usually built from an n-type device and has a parasitic diode ($D_4$) to the substrate. If an additional circuit is not added, $D_4$ will cause a dc level shift (up) of V(net1) and as a consequence, $R_{on}$ of $M_2$ will increase and $C_{Load}$ will be discharged.

Figure 4:
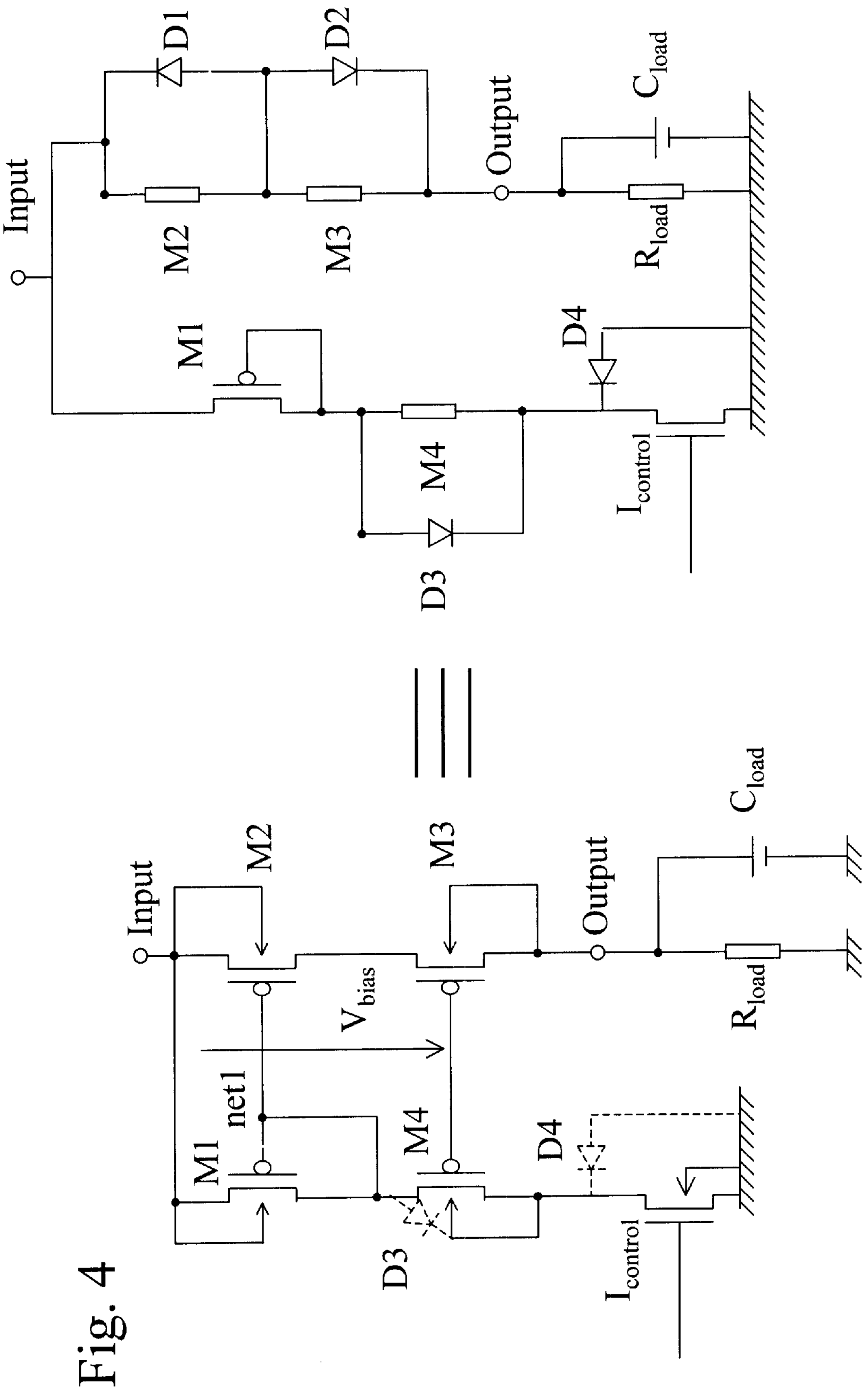
FIG. 4 represents a preferred embodiment of the present invention and its EMC equivalent circuit.

To avoid this, a transistor M4 is added, as can be seen on the left in FIG. 4. $D_4$ is uncoupled from net1: there is no more n-junction on net1. Even if net1 went negative relative to substrate during an EMI event, this would not influence the output voltage significantly. Also shown on FIG. 4 is the EMC equivalent circuit (right).

What is claimed is:

1. A voltage regulator circuit for providing a regulated output voltage at an output terminal, said regulator circuit comprising a current source ($I_{control}$), comprising a current source MOSFET, a current mirror circuit, comprising a driver MOSFET ($M_1$) and a follower MOSFET ($M_2$) both having the source connected to the substrate, interposed between said current source and said output terminal, said current source and current mirror circuit being operatively linked as to regulate an input voltage $V_{in}$ to said regulated output voltage, wherein the voltage regulator circuit further comprises an EMC stabilising MOSFET having its drain connected to its substrate and placed in series with any of said driver or follower MOSFETs.

2. The voltage regulator circuit as in claim 1, wherein the drain of the EMC stabilising MOSFET is coupled to the source of the follower MOSFET.

3. The voltage regulator circuit as in claim 2, wherein the gate of the EMC stabilising MOSFET is coupled to the gate of the follower MOSFET.

4. The voltage regulator circuit as in claim 1, wherein the source of the EMC stabilising MOSFET is coupled to the drain of the follower MOSFET.

5. The voltage regulator circuit as in claim 4, wherein the gate of the EMC stabilising MOSFET is kept at a predetermined voltage ($V_{bias}$).

6. The voltage regulator as in claim 5, wherein the predetermined voltage is external to and independent from the input voltage.

7. Voltage regulator circuit as in claim 1, wherein the drain of the EMC stabilising MOSFET is coupled to the source of the driver MOSFET.

8. Voltage regulator circuit as in claim 1, further comprising a second EMC stabilising MOSFET having its drain connected to its substrate and placed in series with any of the driver or follower MOSFET.

9. The voltage regulator circuit as in claim 8, wherein the source of the EMC stabilising MOSFET is coupled to the drain of the follower MOSFET and the source of the second EMC stabilising MOSFET is connected to the drain of the driver MOSFET, both gates of said EMC stabilising MOSFET and said second EMC stabilising MOSFET being connected.

10. The voltage regulator circuit as in claim 9, wherein the gate of the EMC stabilising MOSFET and the second EMC stabilising MOSFET are kept at a predetermined voltage ($V_{bias}$) which is external to and independent from the input voltage.

11. A method for improving EMC stability of an electronic circuit comprising at least one circuit MOSFET, characterised by the step of providing an EMC stabilising MOSFET placed in series with and in opposite sense to said circuit MOSFET.

* * * * *